(12) United States Patent
Tanaka et al.

(10) Patent No.: US 8,077,001 B2
(45) Date of Patent: Dec. 13, 2011

(54) SUPERCONDUCTING MAGNET

(75) Inventors: Hiroyuki Tanaka, Mito (JP); Norihide Saho, Tsuchiura (JP); Hisashi Isogami, Ushiku (JP); Masaya Takahashi, Hitachinaka (JP); Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 344 days.

(21) Appl. No.: 12/389,417

(22) Filed: Feb. 20, 2009

(65) Prior Publication Data

US 2009/0267716 A1    Oct. 29, 2009

(30) Foreign Application Priority Data

Apr. 28, 2008    (JP) .................... 2008-116565

(51) Int. Cl.
*H01F 1/00*      (2006.01)
*H01F 6/00*      (2006.01)

(52) U.S. Cl. ........................................ 335/216

(58) Field of Classification Search .................... 335/216
See application file for complete search history.

(56) References Cited

U.S. PATENT DOCUMENTS

| | | | | |
|---|---|---|---|---|
| 3,538,714 A * | 11/1970 | Klipping et al. | ............... | 62/47.1 |
| 3,715,452 A * | 2/1973 | Long | ............... | 174/15.4 |
| 4,363,773 A * | 12/1982 | Mine | ............... | 376/142 |
| 4,568,900 A * | 2/1986 | Agatsuma et al. | ............... | 335/216 |
| 5,298,679 A * | 3/1994 | Wu et al. | ............... | 174/15.4 |
| 5,436,606 A * | 7/1995 | Cottevieille et al. | ............... | 335/216 |
| 5,593,517 A * | 1/1997 | Saito et al. | ............... | 148/301 |
| 5,680,085 A * | 10/1997 | Aihara et al. | ............... | 335/216 |
| 6,003,320 A * | 12/1999 | Okamura et al. | ............... | 62/6 |
| 6,005,460 A * | 12/1999 | Garrigus et al. | ............... | 335/216 |
| 6,112,531 A * | 9/2000 | Yamaguchi | ............... | 62/51.1 |
| 6,246,308 B1 * | 6/2001 | Laskaris et al. | ............... | 335/216 |
| 6,324,851 B1 * | 12/2001 | Szasz et al. | ............... | 62/51.1 |
| 6,363,727 B1 * | 4/2002 | Hashimoto et al. | ............... | 62/6 |
| 6,828,889 B1 * | 12/2004 | Zaput | ............... | 335/216 |
| 2003/0011452 A1 * | 1/2003 | Snitchler et al. | ............... | 335/216 |
| 2007/0214802 A1 * | 9/2007 | Nemoto et al. | ............... | 62/47.1 |

FOREIGN PATENT DOCUMENTS

| | | |
|---|---|---|
| EP | 0740314 | 10/1996 |
| JP | 4933592 | 7/1974 |
| JP | 9205016 | 8/1997 |
| JP | 09-298320 | 11/1997 |
| JP | 2003-037303 | 2/2003 |
| JP | 200337303 | 2/2003 |
| JP | 2006-174546 | 6/2006 |

OTHER PUBLICATIONS

Japanese Office Action dated Aug. 17, 2010, issued in corresponding Japanese Patent Application No. 2008-116565.

* cited by examiner

*Primary Examiner* — Elvin G Enad
*Assistant Examiner* — Alexander Talpalatskiy
(74) *Attorney, Agent, or Firm* — Brundidge & Stanger, P.C.

(57) ABSTRACT

A persistent current switch in a superconducting magnet, includes: a winding part in which a superconducting wire is noninductively wound; a winding-heating heater provided around the winding part; a vessel provided around the winding part with a space; and an anti-convective material provided in the space between the vessel and the winding part.

7 Claims, 7 Drawing Sheets

SUPERCONDUCTING MAGNET

CROSS REFERENCE TO RELATED APPLICATIONS

This application claims the benefit of Japanese Patent Application No. 2008-116565 filed on Apr. 28, 2008, the disclosure of which is incorporated herein by reference.

BACKGROUND OF THE INVENTION

1. Field of the Invention

The present invention relates to a superconducting magnet.

2. Description of the Related Art

There have been known two methods of operating a superconducting magnet. One is a method of constantly applying an electric current from a power source to the superconducting magnet. The other is a method called a persistent current mode, in which an electric current persistently flows in a superconducting loop even without current supply from a power source, making use of a superconducting phenomenon of zero electrical resistance.

FIG. 6 is an electrical diagram showing a configuration of a general superconducting magnet provided with a persistent current mode.

In FIG. 6, a superconducting magnet 99 and a persistent current switch 100 are connected in parallel to a power source 101. Wiring for connecting the superconducting magnet 99 and the persistent current switch 100 are made of a superconducting material.

The persistent current switch 100 is turned OFF, if an electrical current is applied to the superconducting magnet 99. The persistent current switch 100 is designed to have an electrical resistance of ten and several ohms, when the persistent current switch 100 is turned OFF. At this time, an electrical resistance of the superconducting magnet 99 is zero. This allows an electric current supplied from the power source 101 to flow to the superconducting magnet 99, which has less electrical resistance. Thus, a current value applied to the superconducting magnet 99 can be manipulated by way of the external power source 101.

After the electric current supplied to the superconducting magnet 99 reaches a designed value, the persistent current switch 100 is turned ON. The persistent current switch 100 is in a superconducting state with zero electrical resistance, when the persistent current switch 100 is turned ON. At this time, the superconducting magnet 99 and the persistent current switch 100 turn superconductive and form a closed circuit or a superconducting loop. An electric current in the superconducting loop flows persistently without attenuation. This eliminates a need of further supplying an electric current from the power source 101, thus enabling the power source 101 to be cut off from the superconducting loop. The superconducting magnet 99 can be then operated in the persistent current mode.

To achieve a magnet having a strong magnetic field, a current as high as multi-hundred amperes is necessary. To keep on supplying an electric current from an external power source, a good amount of running cost is necessary. Meanwhile, if a superconducting magnet is operated in the persistent current mode, running cost is not necessary other than a cost during initial phases of its start-up, because, in principle, only one excitation is enough to persistently operate the superconducting magnet in the persistent current mode. Thus, the persistent current switch is widely used in the superconducting magnet.

Japanese Published Patent Application No. 2003-037303 indicates the following characteristics required for a persistent current switch: 1) its electrical resistance when turned ON is zero or within a range in which magnetic field attenuation is acceptable; 2) its electrical resistance is sufficiently large when turned OFF; 3) it allows an electric current to be supplied to a coil; and 4) its superconducting state is stable.

A superconducting material has no electrical resistance in the superconducting state but does have in a normal conducting state. That is, a persistent current switch can be turned ON or OFF by switching between the superconducting state and the normal conducting state from outside.

Though a persistent current switch can be made of various superconducting materials, niobium-titanium (NbTi) is typically used. NbTi has a critical temperature for superconductors of about 9K and enters a normal conducting state at about 9K or higher. In operation, the persistent current switch is immersed in liquid helium whose boiling point is 4.2K and is thus cooled to 4.2K. To turn OFF, the persistent current switch is required to be heated to the critical temperature thereof for superconductors (in case of NbTi, about 9K) or higher. The persistent current switch is typically turned OFF by heating a noninductive winding part thereof to the critical temperature for superconductors using a heater.

To turn the persistent current switch from OFF to ON, the heater housed in the persistent current switch is just turned off. The persistent current switch is then allowed to be cooled by a surrounding liquid helium until the persistent current switch has the same temperature as that of the surrounding liquid helium after a certain period of time. Japanese Published Patent Application No. H09-298320 proposes a configuration of a persistent current switch in which a heater is arranged for promoting a rise in temperature, and evaporated helium gas is stored around the persistent current switch for enhancing heating efficiency.

However, the persistent current switch using NbTi has a problem. The NbTi-using persistent current switch has the critical temperature for superconductors of as low as about 9K, of which temperature difference from the surrounding liquid helium (boiling point: 4.2K) is small. Even a slight rise in temperature owing to very little heat generation causes the persistent current switch to transit from the superconducting state to the normal conducting state. In general, the lower a temperature of an object becomes, the smaller a specific heat of the object becomes. In a system such as a persistent current switch, in which a large current flows, a localized heat generation can push a portion of the persistent current switch into the normal conducting state, and an electrical resistance produced in the portion generates more heat, to thereby end up with a quench.

The quench not only causes the persistent current switch to stop operation but may result in fatal damage thereto, in particular, to a high-field magnet in which a huge amount of energy is stored.

Japanese Published Patent Application No. 2003-037303 discloses that usage of a material having a high critical temperature for superconductors is effective for enhancing stability of a superconducting material and proposes a persistent current switch using $MgB_2$ (critical temperature for superconductors: 39K) and having more stability.

As described above, the persistent current switch can have a stable superconducting state by using a superconducting material having a high critical temperature for superconductors such as, for example, $MgB_2$ (critical temperature for superconductors: 39K). There is a problem, however, that a higher critical temperature for superconductors increases a heating amount to be provided by a heater. The heater is used for raising a temperature of the persistent current switch from that of the liquid helium in which the persistent current switch is cooled, to the critical temperature or higher. Another problem is that an increase in the heating amount also increases evaporation of the liquid helium.

FIG. 7 is a cross sectional view showing a configuration of a persistent current switch according to a related art.

In FIG. 7, a persistent current switch includes as principal components a winding part 20 and an extracting part 21. The winding part 20 includes a wire 10 wound around a bobbin 12. The wire 10 used herein is made of a superconducting material.

The extracting part 21 includes: the wire 10 extending from the winding part 20; a NbTi wire 11 connected to a superconducting magnet (not shown); and a superconducting connection 15 for connecting the wire 10 and the NbTi wire 11, all of which form a superconducting loop.

The wire 10 is required to have a certain length for obtaining an electrical resistance in the normal superconducting state. The wire 10 is herein wound around the bobbin 12 for making the winding part 20 compact. If the wire 10 is just simply wound therearound, however, an inductive magnetic field having a main axis in an axial direction of the bobbin 12 will be generated when an electric current flows in the wire 10. To avoid this, the wire 10 is noninductively wound. That is, the wire 10 is first bent in half, and then, the doubled wire 10 is wound around the bobbin 12 as it is.

A winding-heating heater 5 is fixed so as to be thermally in contact with the wire 10 noninductively wound around the bobbin 12. An electrical insulator (not shown) is inserted between the winding-heating heater 5 and the wire 10, thereby preventing a short circuit.

The wire 10 used herein is made of magnesium diboride ($MgB_2$). $MgB_2$ is characterized by its high superconducting critical temperature as high as 39K and is a relatively new superconducting material reported in Nature 410, 63-64 (2001). Niobium tin ($Nb_3Sn$) is a well-known metallic superconducting material, but its superconducting critical temperature is about 23K. The superconducting critical temperature of $MgB_2$ is about 15K higher than $Nb_3Sn$. The higher the superconducting critical temperature of a superconducting material is, compared to the temperature of the liquid helium (4.2K) as a cryogen, the more the superconducting material has stability.

The persistent current switch according to the related art as described above was manufactured and was inserted into a vessel filled with liquid helium. A heat quantity necessary for turning ON or OFF of the persistent current switch was measured. The switch according to the related art required a heating amount of about 60 W.

In the meantime, an evaporative latent heat of the liquid helium is 20.7 kJ/kg. A density thereof is 124.9 kg/$m^3$. Based on these values, a consumption of the liquid helium, which will evaporate, is measured to be 80 liters or more per hour. The liquid helium is a highly-priced cryogen, and an increase in the consumption of the liquid helium directly leads to an increase in operating cost.

The persistent current switch consumes a large quantity of liquid helium, because, in regulating a magnetic field flowing in a superconducting coil, the switch is required to keep an OFF state thereof, that is, to maintain an ON state of a heater.

In this regard, a persistent current switch using conventional NbTi does not require a large heating amount inputted by a heater because the critical temperature for superconductors of NbTi is low. A heater of about 5 W is sufficient to turn the switch ON or OFF.

As described above, there is a problem that a persistent current switch using $MgB_2$ or any other superconducting material having a high critical temperature for superconductors requires cost of the liquid helium ten times more or higher than that using the conventional superconducting material.

To achieve a practical use of a persistent current switch using the material having a high critical temperature for superconductors such as $MgB_2$, there is a need for a configuration in which heat load of a heater necessary to turn the persistent current switch ON or OFF is lowered.

To solve the above problems, the present invention has been made in an attempt to provide a superconducting magnet provided with a persistent current switch capable of lowering a heating amount which is necessary for a heater to turn the persistent current switch OFF, even if the persistent current switch is made of a superconducting material having a high critical temperature for superconductors.

SUMMARY OF THE INVENTION

A superconducting magnet includes a persistent current switch for operating in a persistent current mode. The persistent current switch includes: a winding part in which a superconducting wire is noninductively wound; a winding-heating heater for heating the winding part to a critical temperature thereof or higher by thermally being in contact with the winding part; a vessel provided around the winding part and the winding-heating heater with a space between the vessel and the winding part and the winding-heating heater; and an anti-convective material provided in the space between the vessel and the winding part and the winding-heating heater.

The persistent current switch further includes a gas storage part for storing gas in a space defined by a top surface of the vessel, the winding part, and the winding-heating heater.

The persistent current switch has a cryogen-heating heater provided in the gas storage part.

The persistent current switch has a through hole penetrating the vessel and provided below a lower surface of the winding part.

The persistent current switch has a through hole penetrating the vessel above the winding part, and a cross sectional area of the through hole is smaller than a cross sectional area of the through hole provided below the lower surface of the winding part.

The anti-convective material of the persistent current switch is made of a porous material.

The persistent current switch has the superconducting wire of the winding part made of a superconducting material having a critical temperature for superconductors thereof higher than a critical temperature of niobium titanium.

Other features and advantages of the present invention will become more apparent from the following detailed description of the invention, when taken in conjunction with the accompanying exemplary drawings.

DETAILED DESCRIPTION OF THE EXEMPLARY EMBODIMENTS

Figure 1:
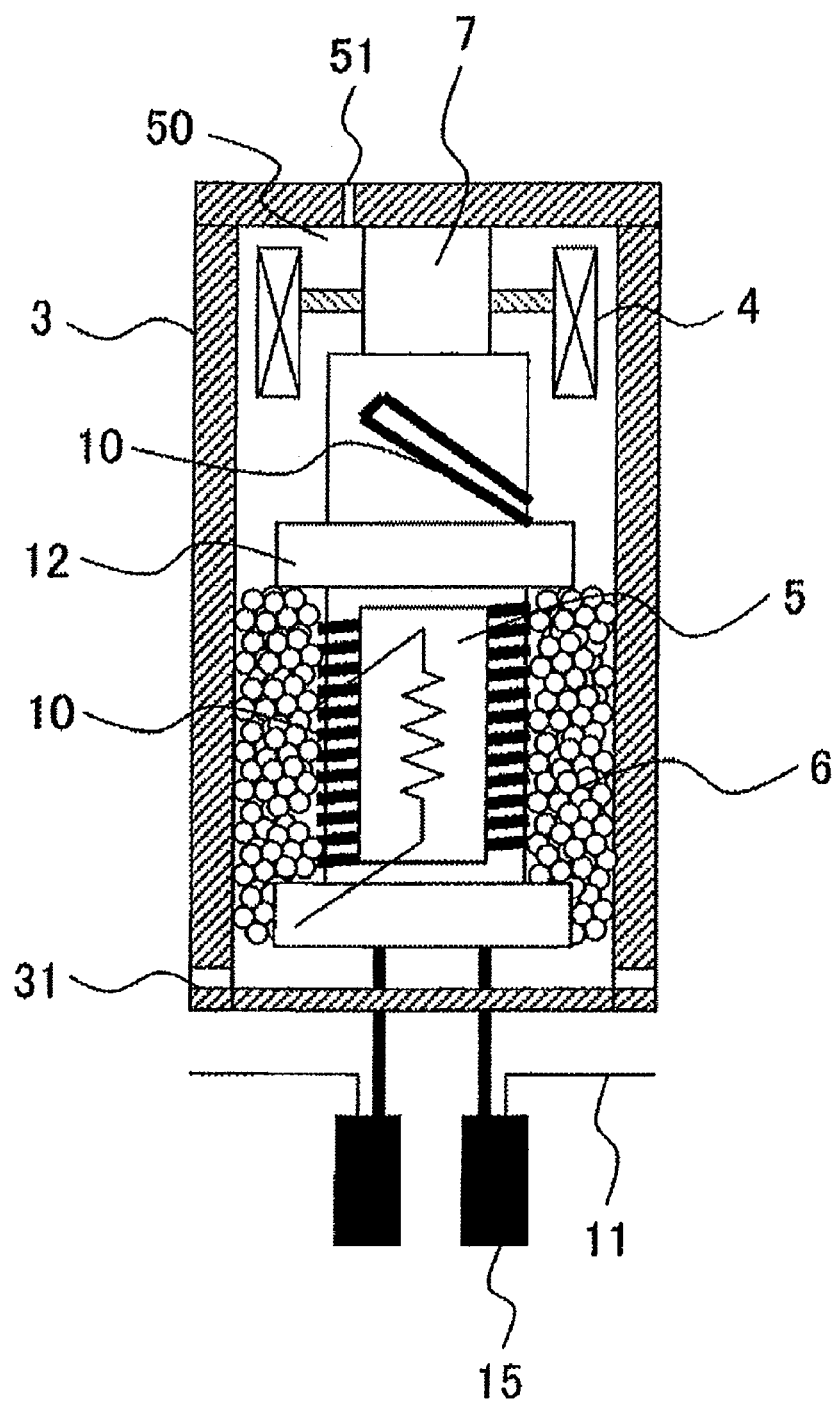
FIG. 1 is a cross sectional view showing a configuration of a persistent current switch according to a first embodiment of the present invention.
Figure 2:
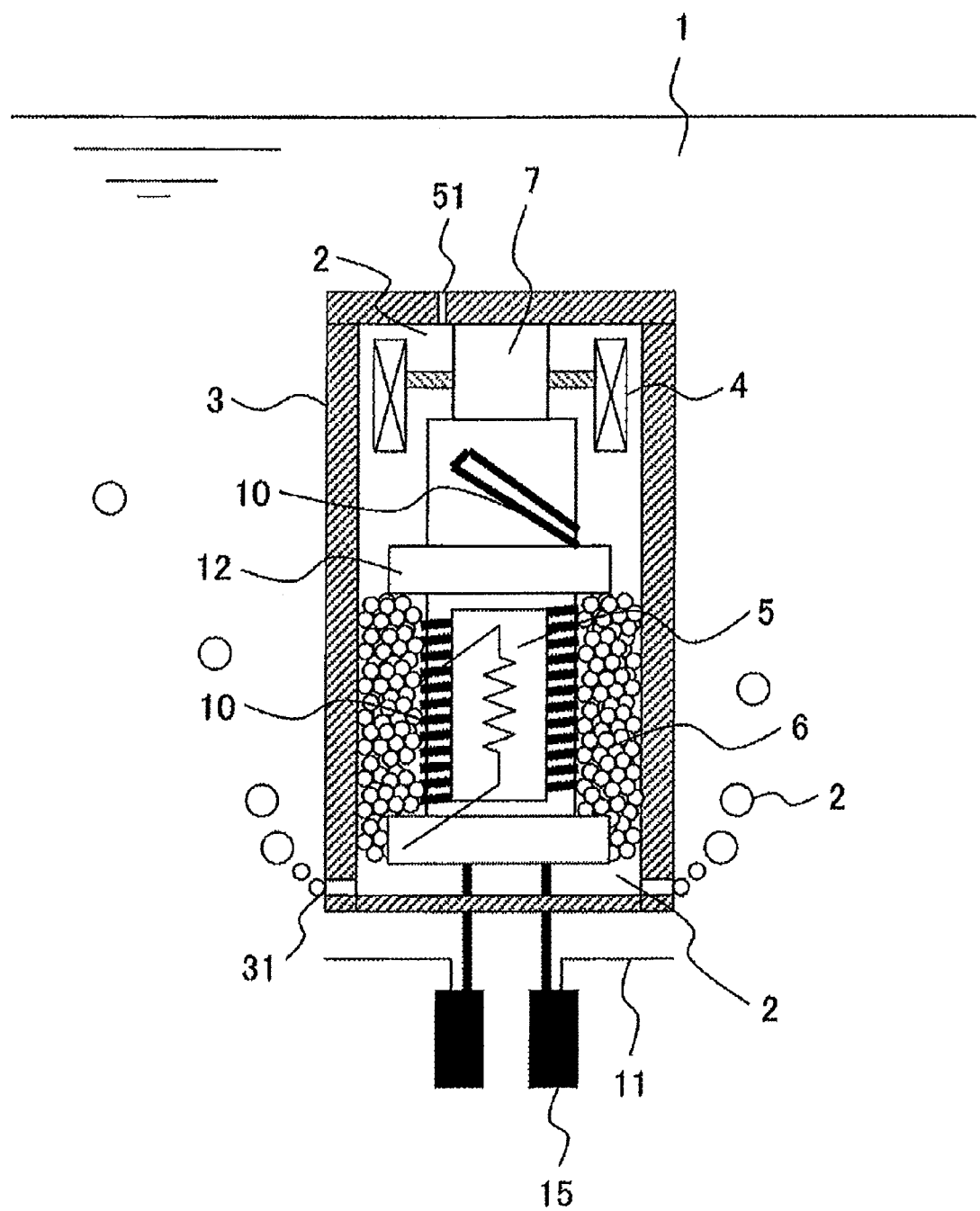
FIG. 2 is a cross sectional view showing a state of the persistent current switch when a temperature is raised according to the first embodiment.
Figure 7:
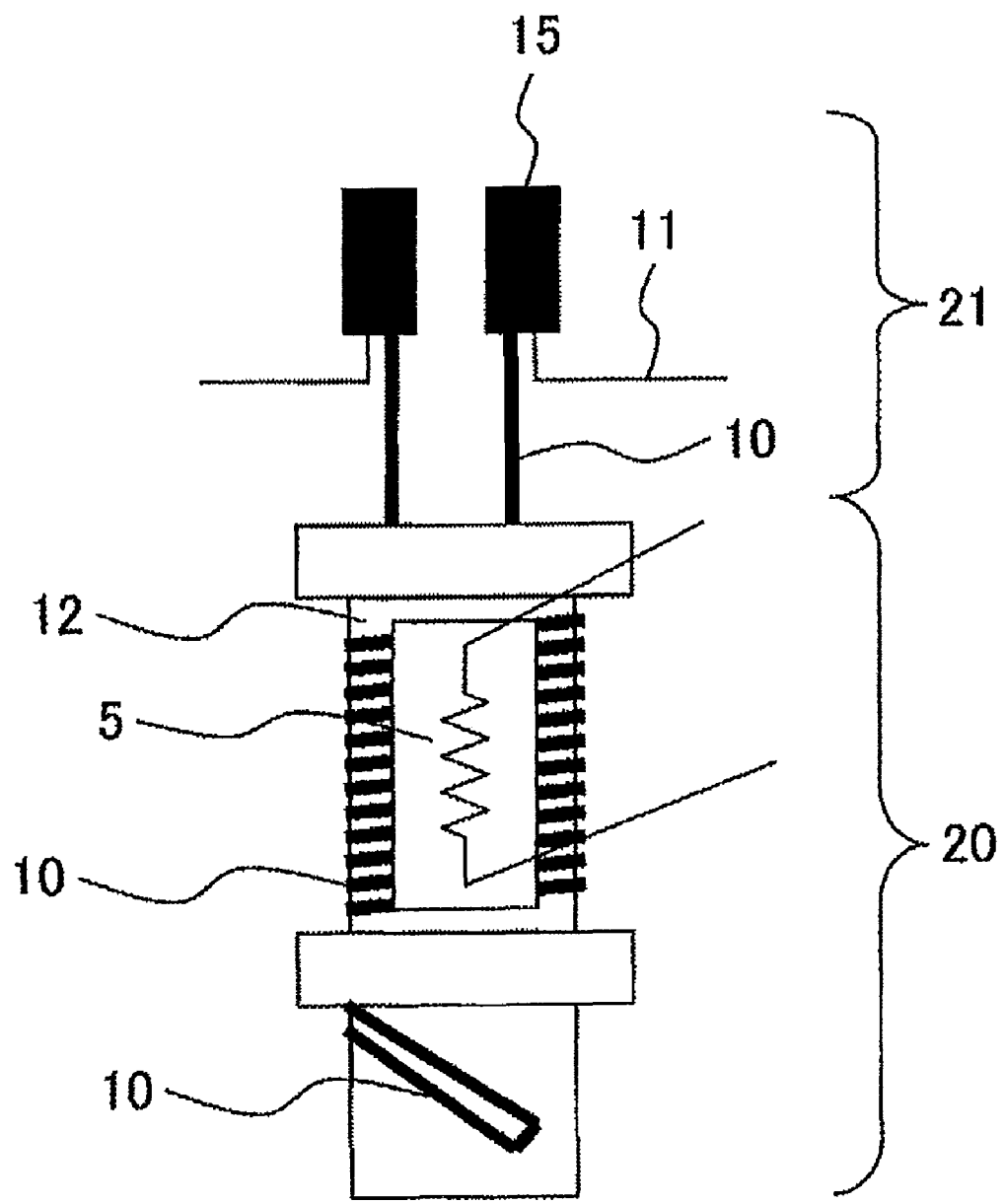
FIG. 7 is a view showing a configuration of a persistent current switch according to a related art.

The winding part and the extracting part according to the exemplary embodiments of the present invention shown in FIG. 2 have same configurations as those according to the related art shown in FIG. 7. Thus, the winding part 20 and the extracting part 21 according to the exemplary embodiments are described below but are not shown in FIG. 1 through FIG. 5 for simplification.

In the embodiments, the superconductive wire 10 is non-inductively wound and fixed around the bobbin 12 as in the related art. The extracting part 21 includes the wire 10 extending from the winding part 20, a NbTi wire 11 connected to a superconducting magnet, and a superconducting connection 15 for connecting the wire 10 and the NbTi wire 11, all of which form a superconducting loop. The winding-heating heater 5 is disposed around the winding part 20.

The winding-heating heater 5 may be disposed not only outside of the wire 10 but also between the wire 10 and the bobbin 12, thus enabling heating efficiency to be enhanced.

Next is described a first embodiment with reference to FIG. 1.

First Embodiment

FIG. 1 is a cross sectional view showing a configuration of a persistent current switch according to the first embodiment of the present invention.

In FIG. 1, a vessel 3 houses therein the winding part 20 (not shown). A side surface of an inner wall of the vessel 3 is spaced apart from a side face of the winding part 20. In this embodiment, an inner diameter of the vessel 3 is 58 mm, and an outer diameter of the winding part 20 is 50 mm. The vessel 3 has a through hole 31 below a lower surface of the winding part 20. A size and the number of the through hole 31 is adjusted according to a liquid level of liquid helium and a position to which the persistent current switch is attached.

The size of the through hole 31 is required to be large enough such that a pressure inside the vessel 3 in a state of being filled with helium gas 2 (see FIG. 2) is higher than a pressure exerted by the liquid level. For example, if the size of the through hole 31 is too large or the through holes 31 are too large in number, a larger amount of the helium gas 2 flows from the through hole(s) 31 into the liquid helium 1. This decreases the pressure inside the vessel 3. A gas-liquid interface generated in a lower portion of the persistent current switch is subjected to an elevating force up to the liquid level of the liquid helium 1, if the pressure inside the vessel 3 is the same as an ambient pressure. This is because, if the pressure inside the vessel 3 is not maintained higher than the ambient pressure, the liquid helium 1 intrudes into the vessel 3.

A support member 7 fixes the winding part 20 to an upper portion of the inner wall of the vessel 3. An upper end of the winding part 20 is spaced apart 30 mm from an uppermost portion of the inner wall, in which a cryogen-heating heater 4 is provided. The cryogen-heating heater 4 heats cryogen stored in the vessel 3. The cryogen-heating heater 4 may also serve as a winding-heating heater 5 for heating the winding part 20. In this case, the winding-heating heater 5 is extended to a space between the upper end of the winding part 20 and the uppermost portion of the inner wall of the vessel 3.

There is a space between the side surface of the winding part 20 and the side surface of the inner wall of the vessel 3. The space is provided with an anti-convective material 6. The anti-convective material 6 prevents convection of the cryogen, generated between a wall of the vessel 3 which is cooled by the liquid helium 1 (see FIG. 2) surrounding the vessel 3 up to a temperature of the liquid helium 1, and the winding part 20 which is heated to its critical temperature or higher for transition to a superconducting state.

The anti-convective material 6 is made of a porous material. Intrusion of the liquid helium 1 into gaps in the porous material ensures a contact between the liquid helium 1 and the winding part 20, thus allowing the liquid helium 1 to directly cool the winding part 20. The porous material used herein is a filter for use in an air cleaner or the like. The porous material suitably used at such an extremely low temperature may include teflon (registered trademark), polyethylene, polystyrene, and glass.

Another material of which the anti-convective material 6 is made may be, for example, glass balls, which have small thermal conductivity. An outer wall of the vessel 3 is in contact with the liquid helium 1, and the inner wall thereof is in contact with heated helium gas. Heat of the helium gas heated in the vessel 3 is conducted through the vessel 3 to the liquid helium 1, which evaporates the liquid helium 1. In this state, heating of the winding part 20 evaporates not the helium gas in the vessel 3 but the liquid helium 1 surrounding the vessel 3, which decreases heating efficiency of the winding part 20. To avoid this, the vessel 3 is required to be made of a material having low thermal conductivity so as to keep heat transfer from the inner wall to the outer wall of the vessel 3 low. The vessel 3 used herein is made of glass fiber reinforced plastic (GFRP).

FIG. 2 is a cross sectional view showing a state of the persistent current switch when a temperature is raised according to the first embodiment.

In FIG. 2, to turn the persistent current switch OFF, a temperature of the winding part 20 is required to be raised to the critical temperature thereof or higher. In the persistent current switch of the present invention, the cryogen-heating heater 4 is turned ON so as to vaporize the liquid helium 1 present in the top surface of the vessel 3. The vaporized helium gas 2 is stored in an upper portion of the vessel 3. The cryogen-heating heater 4 further heats the helium gas 2 stored in the upper portion of the vessel 3, which expands the heated helium gas 2. The expanded helium gas 2 forces the liquid helium 1 stored in the vessel 3 out of the vessel 3 through the through hole 31 positioned in a lower portion of the vessel 3. This runs out of the liquid helium 1 in a surrounding portion of the winding part 20, thus remaining only the helium gas 2 therein. Then, the winding-heating heater 5 in the winding part 20 is turned ON. Since the liquid helium 1 is not present in the surrounding portion of the winding part 20, the winding-heating heater 5 can efficiently raise the temperature of the winding part 20.

Herein, there is a difference in temperature between the winding part 20 heated to its critical temperature or over and the vessel 3 being in contact with the liquid helium 1. Further, a density of helium gas at 4.2K, which is 16 kg/m$^3$, is 10 times higher than that at 42K, which is 1.6 kg/m$^3$. The helium gas 2 heated around the winding part 20 decreases its density and goes upward owing to an ascending force generated by a difference in density from its surrounding region. On the other hand, the helium gas 2 near the vessel 3 in contact with the liquid helium 1 is cooled, increases its density, and goes downward.

As described above, natural convection is generated in the space between the winding part 20 and the vessel 3. That is, a flow of the helium gas 2 generates heat transfer from the winding part 20 to the vessel 3, which decreases the temperature of the winding part 20 and increases that of the vessel 3. In other words, heat applied to the winding part 20 is conducted to the vessel 3, thus reducing heating efficiency. If the natural convection is suppressed, the heat transfer between the winding part 20 and the vessel 3 can be suppressed, allowing the heating efficiency at the winding part 20 to be enhanced.

To achieve such an enhanced heating efficiency as described above, the anti-convective material 6 made of a porous material is disposed in the space between the winding part 20 and the vessel 3. In FIG. 2, glass balls (5 mm in each diameter) as the anti-convective material 6 fill the space between the winding part 20 and the vessel 3. Even if the space is filled with the glass balls, the liquid helium 1 or the helium gas 2 can easily pass through gaps present between the neighboring glass balls. On the other hand, the anti-convective material 6 such as the glass balls serves as a liquid resistance against the natural conviction, thus preventing the natural conviction from occurring.

A size of the glass balls is not limited to be uniform. The glass balls of different sizes may be provided to adjust porosity according to the necessity. Another advantage of using the anti-convective material 6 is that a space occupied by cryogen in the vessel 3 can be made smaller. This results in a smaller quantity of the liquid helium 1 or the helium gas 2 which is to be pushed out from the inside to the outside of the vessel 3.

The persistent current switch was actually manufactured, and a heat quantity necessary for changing over the switch was measured. A persistent current switch according to a conventionally-known complete immersion technique required a heating amount of 60 W. Meanwhile, the persistent current switch according to this embodiment of the present invention which includes the vessel 3 required the heating amount of as low as 7 W. Further, the persistent current switch according to this embodiment which also includes the anti-convective material 6 made of a porous material and the cryogen-heating heater 4 required the heating amount of only 5 W.

Figure 3:
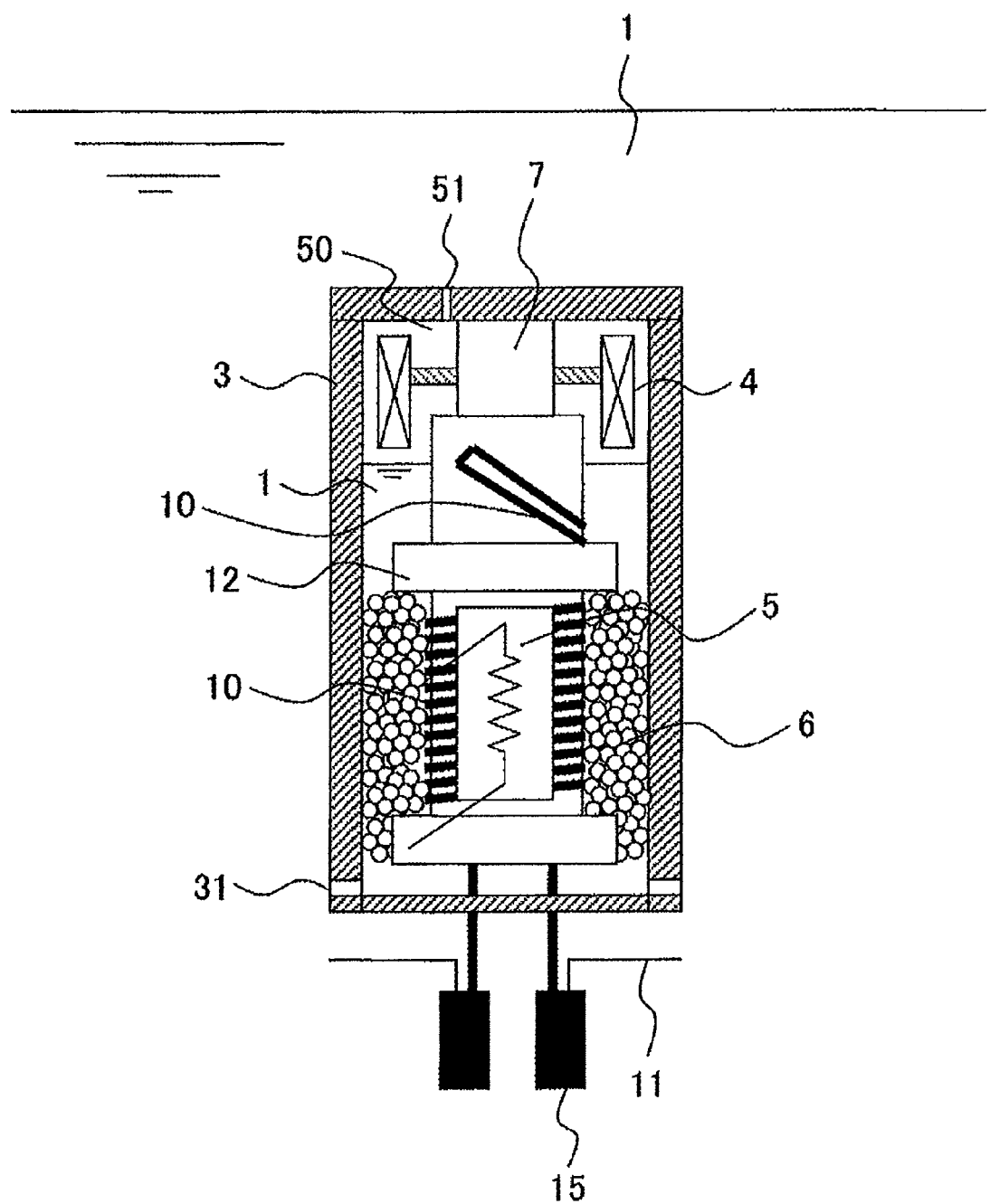
FIG. 3 is a view showing a state of the persistent current switch when heating is stopped according to the first embodiment.

FIG. 3 is a view showing a state of the persistent current switch when heating is stopped according to the first embodiment.

In FIG. 3, when heating by the cryogen-heating heater 4 and the winding-heating heater 5 disposed in the winding part 20 is stopped, the helium gas 2 stored in the vessel 3 is cooled from its surrounding region. The cooled helium gas 2 increases in density and decreases in volume. As described above, a density ratio between the helium gas at 40K and at 4.2K is about 1:10, which means that the volume of the helium gas reduces to about one tenth after cooling.

Further, a pressure exerted by a liquid level of the liquid helium 1 raises a gas-liquid interface in the vessel 3. The helium gas 2 in the vessel 3 is compressed, and a pressure thereof is increased. The helium gas 2 having the increased pressure determines a saturated vapor pressure in the vessel 3. The increased pressure in the vessel 3 elevates a boiling point of the helium gas 2 in the vessel 3. The helium gas 2 in the vessel 3 is gradually condense, because the boiling point of the helium gas 2 in the vessel 3 becomes higher than a boiling point of the liquid helium 1 surrounding the helium gas 2.

After an elapse of a certain period of time, the helium gas 2 in the vessel 3 is entirely condensed, and the vessel 3 is completely filled with the liquid helium 1. A helium gas storage part 50 is disposed in the upper portion of the vessel 3 so as to allow the liquid level of the liquid helium 1 go up to the upper end of the winding part 20 when the helium gas 2 in the vessel 3 is cooled to its saturated temperature (4.2K) after the heating is stopped. A small through hole 51 may be created so as to discharge the helium gas 2 in the upper portion of the vessel 3. A bore diameter of the small through hole 51 is needed to be smaller than a cross-sectional area of the through hole 31 which is created below a lowermost surface of the winding part 20.

In the present invention, magnesium diboride ($MgB_2$) is used as a superconducting material. However, the present invention is not limited to this. A persistent current switch in which conventional NbTi (critical temperature for superconductors: about 9K) or $Nb_3Sn$ (critical temperature for superconductors: about 23K) is used may also suppress an amount of cryogen evaporation.

A superconducting magnet provided with the persistent current switch according to the present invention has a higher temperature for turning OFF the persistent current switch than the conventional persistent current switch using NbTi. This makes a larger difference between a temperature of the liquid helium 1 and the critical temperature for superconductors, thus enhancing reliability against quenching. The superconducting magnet having such a high reliability against quenching can be applied to a magnetically-levitated train for transporting passengers at high speed or a magnetic resonance imaging (MRI) for examining internal parts of a human body.

Second Embodiment

Figure 4:
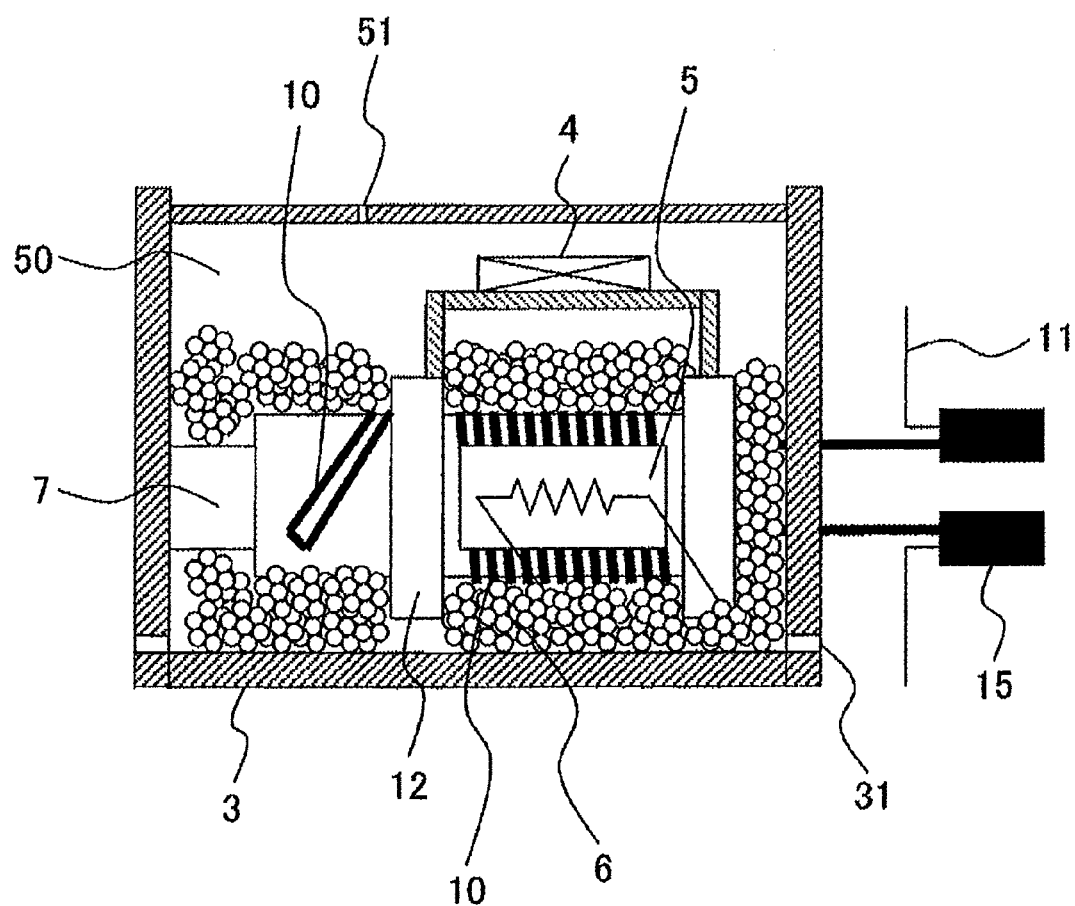
FIG. 4 is a cross sectional view showing a configuration of a persistent current switch according to a second embodiment of the present invention.

FIG. 4 is a cross sectional view showing a configuration of a persistent current switch according to a second embodiment of the present invention.

FIG. 4 assumes that the persistent current switch is horizontally disposed due to, for example, a height restriction. The support member 7 fixes the winding part 20 in which the superconductive wire is wound around, to the inner wall of the vessel 3 disposed around the winding part 20. In FIG. 4, the winding part 20 is fixed from the side surface of the vessel 3. However, the winding part 20 may be fixed from the top surface or a bottom surface of the vessel 3.

The vessel 3 is also horizontally arranged. The vessel 3 has the through hole 31 below the lowermost surface of the winding part 20 disposed in the vessel 3. The helium gas storage part 50 is disposed in the upper portion of the vessel 3. The cryogen-heating heater 4 is disposed in the helium gas storage part 50. If the extracting part 21 (see FIG. 7) into which the superconducting wire is extracted from the winding part 20 penetrates the vessel 3, a hole through which the extracting part 21 penetrates the vessel 3 is filled with an adhesive or the like so as to prevent the helium gas 2 stored in the vessel 3 from leaking.

If the hole through which the extracting part 21 penetrates the vessel 3 is positioned lower than the lowermost surface of the winding part 20, the hole may be used as the through hole 31 for discharging the helium gas 2. In this case, however, a cross sectional area of the hole is required to be within a range capable of keeping the pressure in the vessel 3 higher than the pressure exerted by the liquid level.

Third Embodiment

Figure 5:
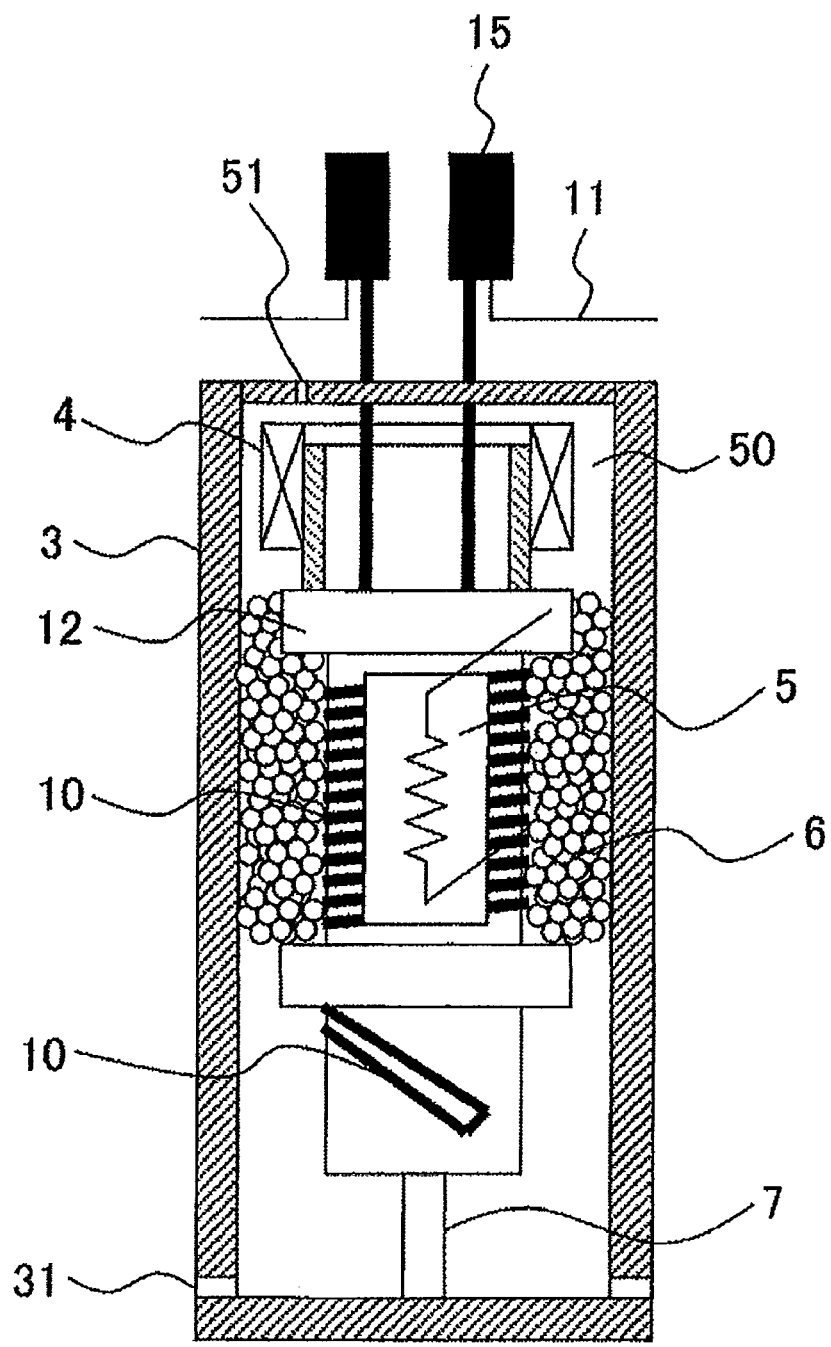
FIG. 5 is a cross sectional view showing a configuration of a persistent current switch according to a third embodiment of the present invention.
Figure 6:
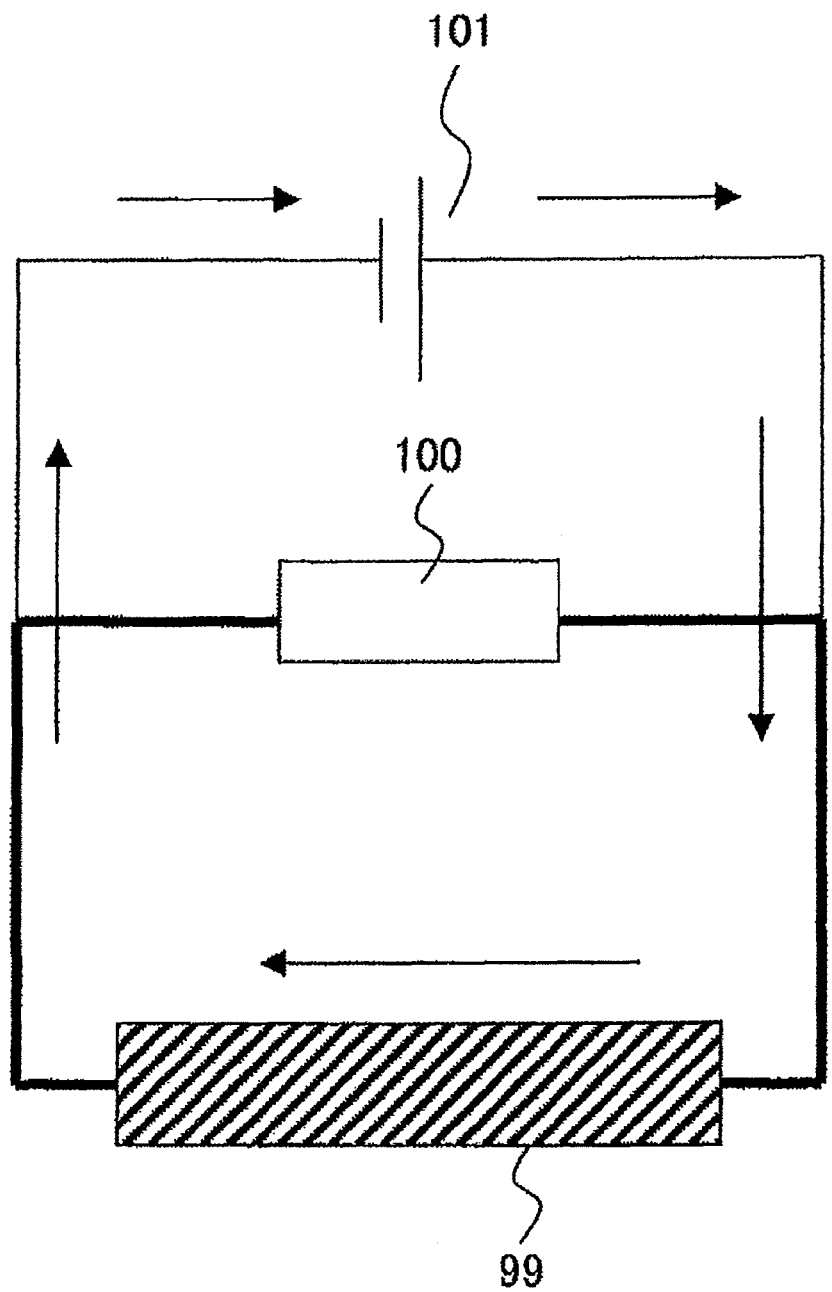
FIG. 6 is an electrical diagram showing a configuration of a general superconducting magnet provided with a persistent current mode.

FIG. 5 is a cross sectional view showing a configuration of a persistent current switch according to a third embodiment of the present invention.

FIG. 5 assumes that the persistent current switch described in the first embodiment is disposed upside down due to, for example, a restriction in placing the extracting part 21. The support member 7 fixes the winding part 20 in which superconductive wire is wound around, to the inner wall of the vessel 3 disposed around the winding part 20. In FIG. 5, the winding part 20 is fixed from the bottom surface of the vessel 3. However, the winding part 20 may be fixed from the top surface or side surface of the vessel 3.

The vessel 3 has the through hole 31 below the lowermost surface of the winding part 20 fixed into the vessel 3. The helium gas storage part 50 is disposed at the upper portion of the vessel 3. The cryogen-heating heater 4 is disposed in the helium gas storage part 50. Since the extracting part 21 penetrates the vessel 3, a hole through which the extracting part 21 penetrates the vessel 3 is filled with an adhesive or the like so as to prevent the helium gas 2 stored in the vessel 3 from leaking.

If the hole through which the extracting part 21 penetrates the vessel 3 is positioned lower than the lowermost surface of the winding part 20, the hole may be used as the through hole 31. In this case, however, the cross sectional area of the hole as the through hole 31 is required to be within a range capable of keeping the pressure in the vessel 3 higher than the pressure exerted from the liquid level.

The present invention is directed to a configuration and an operation of a persistent current switch making use of superconductivity and can be suitably applied to equipment using a superconducting magnet such as a nuclear magnetic resonance analyzer, a magnetic resonance imaging apparatus for medical use, a superconducting power storage facility, and a magnetically-levitated train.

The embodiments according to the present invention have been explained as aforementioned. However, the embodiments of the present invention are not limited to the explanation, and those skilled in the art ascertain the essential characteristics of the present invention and can make the various modifications and variations to the present invention to adapt it to various usages and conditions without departing from the spirit and scope of the claims.

The invention claimed is:

1. A superconducting magnet comprising:
   a persistent current switch for operating in a persistent current mode,
   wherein the persistent current switch comprises:
      a winding part in which a superconducting wire is non-inductively wound;
      a winding-heating heater for heating the winding part to a critical temperature thereof or higher by thermally being in contact with the winding part;
      a vessel provided around the winding part and the winding-heating heater with a space between the vessel and both the winding part and the winding-heating heater; and
      an anti-convective material provided in the space between the vessel and both the winding part and the winding-heating heater.

2. The superconducting magnet according to claim 1,
   wherein the persistent current switch further comprises a gas storage part for storing gas in a space defined by a top surface of the vessel, the winding part, and the winding-heating heater.

3. The superconducting magnet according to claim 2,
   wherein the persistent current switch has a cryogen-heating heater provided in the gas storage part.

4. The superconducting magnet according to claim 1,
   wherein the persistent current switch has a through hole penetrating the vessel and provided below a lower surface of the winding part.

5. The superconducting magnet according to claim 4,
   wherein the persistent current switch has a through hole penetrating the vessel and provided above the winding part, and a cross sectional area of the through hole is smaller than a cross sectional area of the through hole provided below the lower surface of the winding part.

6. The superconducting magnet according to claim 1,
   wherein the anti-convective material of the persistent current switch is made of a porous material.

7. The superconducting magnet according to claim 1,
   wherein the persistent current switch has the superconducting wire of the winding part made of a superconducting material having a critical temperature thereof higher than a critical temperature of niobium titanium.

* * * * *